United States Patent
Togo et al.

(10) Patent No.: US 12,356,746 B2
(45) Date of Patent: Jul. 8, 2025

(54) PHOTOELECTRIC CONVERSION APPARATUS AND EQUIPMENT

(71) Applicant: CANON KABUSHIKI KAISHA, Tokyo (JP)

(72) Inventors: Kenji Togo, Kanagawa (JP); Hideaki Ishino, Tokyo (JP); Yoshiyuki Hayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 232 days.

(21) Appl. No.: 17/224,988

(22) Filed: Apr. 7, 2021

(65) Prior Publication Data

US 2021/0327939 A1 Oct. 21, 2021

(30) Foreign Application Priority Data

Apr. 15, 2020 (JP) ................. 2020-072882

(51) Int. Cl.
*H10F 39/00* (2025.01)
*H10F 39/18* (2025.01)

(52) U.S. Cl.
CPC ....... *H10F 39/8057* (2025.01); *H10F 39/024* (2025.01); *H10F 39/182* (2025.01); *H10F 39/8053* (2025.01); *H10F 39/8063* (2025.01); *H10F 39/811* (2025.01)

(58) Field of Classification Search
CPC ......... H01L 27/14623; H01L 27/14621; H01L 27/14627; H01L 27/14636; H01L 27/14645
See application file for complete search history.

(56) References Cited

U.S. PATENT DOCUMENTS

| 11,362,122 | B2 * | 6/2022 | Nishikido | ......... H01L 27/14685 |
| 2019/0115383 | A1 | 4/2019 | Hara et al. | |
| 2020/0083263 | A1 * | 3/2020 | Tanaka | ............. H01L 27/14603 |

FOREIGN PATENT DOCUMENTS

| CN | 110137190 A | 8/2019 |
| CN | 110770907 A | 2/2020 |
| CN | 110896083 A | 3/2020 |
| JP | 2009-164247 A | 7/2009 |
| JP | 2011082386 A | 4/2011 |
| JP | 2019-012739 A | 1/2019 |
| JP | 2019075441 A | 5/2019 |
| JP | 2019-140252 A | 8/2019 |

* cited by examiner

*Primary Examiner* — Jay C Kim
*Assistant Examiner* — Woo K Lee
(74) *Attorney, Agent, or Firm* — Canon U.S.A., Inc. IP Division

(57) ABSTRACT

The distance between an upper end of a light-shielding portion and a photoelectric conversion layer is longer than the distance between the lower surface of a light-shielding film and the photoelectric conversion layer. The distance between a lower end of the light-shielding portion and the photoelectric conversion layer is shorter than the distance between the lower surface of the light-shielding film and the photoelectric conversion layer. In a plane including the light-shielding film and the light-shielding portion, an opening defined by the light-shielding portion and a gap between the light-shielding portion and the light-shielding film are provided, and the width of the gap is smaller than the width of the opening.

34 Claims, 10 Drawing Sheets

PHOTOELECTRIC CONVERSION APPARATUS AND EQUIPMENT

BACKGROUND OF THE DISCLOSURE

Field of the Disclosure

The aspect of the embodiments relates to photoelectric conversion apparatuses.

Description of the Related Art

A photoelectric conversion apparatus is provided with light-receiving pixels and light-shielded pixels. Each light-shielded pixel is shielded from light by a light-shielding film. Shielding between the light-receiving pixels using a light-shielding wall prevents crosstalk from occurring.

Japanese Patent Application Laid-Open No. 2019-12739 discusses a solid-state image sensor including light-shielded pixels each including a light-shielding film disposed near a color filter in an insulating layer, and a light-shielding wall disposed in the insulating layer between pixels.

The technique discussed in Japanese Patent Application Laid-Open No. 2019-12739 still has room for improvement in optical characteristics. That is, for example, crosstalk is likely to occur in effective pixels at ends of an optical black (OPB) pixel region in an effective pixel region.

SUMMARY OF THE DISCLOSURE

According to an aspect of the embodiments, an apparatus including a light-receiving pixel region and a light-shielded region includes a photoelectric conversion layer including a plurality of photoelectric conversion portions, a light-shielding portion over the photoelectric conversion layer in the light-receiving pixel region, the light-shielding portion surrounding each light-transmitting portion as an optical path for light incident on each of the plurality of photoelectric conversion portions in the light-receiving pixel region, and a light-shielding film along a principal surface of the photoelectric conversion layer, the light-shielding film being over the photoelectric conversion layer in the light-shielded region. The light-shielding portion includes a lower end as an end nearer the photoelectric conversion layer in a first direction perpendicular to the principal surface of the photoelectric conversion layer, and an upper end as an end opposite to the lower end of the light-shielding portion in the first direction. The light-shielding film includes a lower surface as a surface nearer the photoelectric conversion layer in the first direction, and an upper surface as a surface opposite to the photoelectric conversion layer in the first direction. A distance between the upper end of the light-shielding portion and the photoelectric conversion layer is longer than a distance between the lower surface of the light-shielding film and the photoelectric conversion layer. A distance between the lower end of the light-shielding portion and the photoelectric conversion layer is shorter than the distance between the lower surface of the light-shielding film and the photoelectric conversion layer. In a plane including the light-shielding film and the light-shielding portion, an opening defined by the light-shielding portion and a gap between the light-shielding portion and the light-shielding film are provided. A width of the gap in a second direction in which the opening and the gap are arranged side by side is narrower than a width of the opening in the second direction.

Further features of the disclosure will become apparent from the following description of exemplary embodiments with reference to the attached drawings.

DESCRIPTION OF THE EMBODIMENTS

Figure 1A:
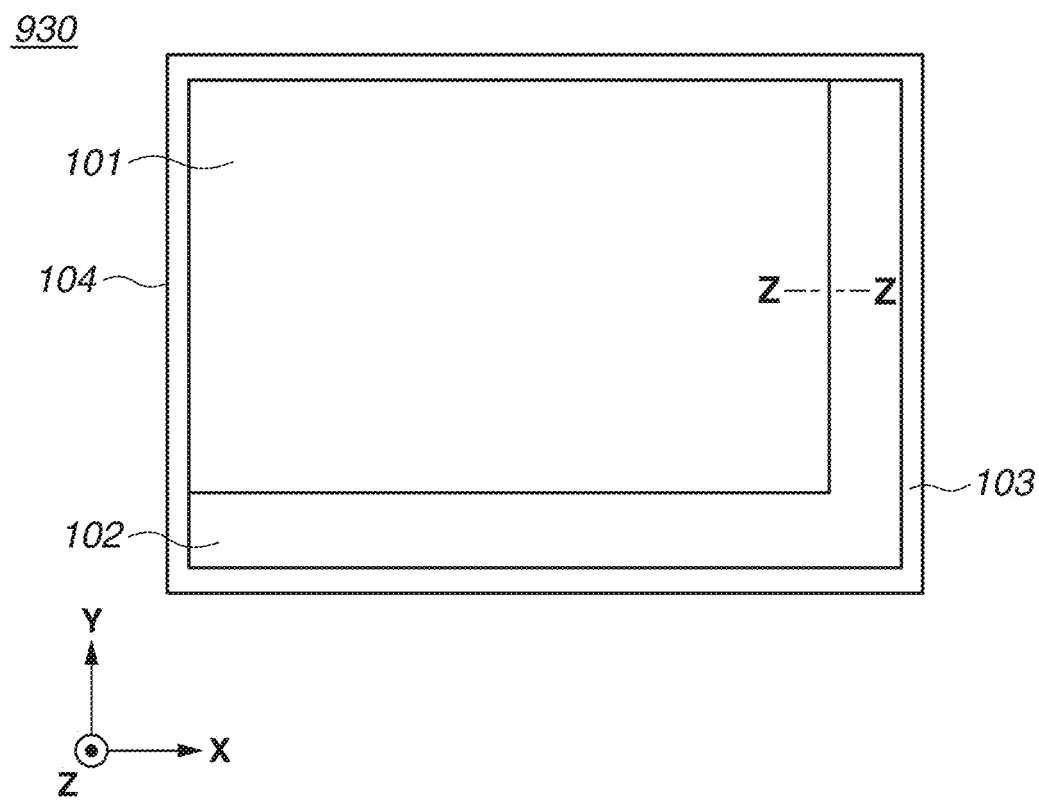
FIG. 1A is a plan view illustrating a configuration of a photoelectric conversion apparatus according to a first exemplary embodiment.

Exemplary embodiments for implementing the disclosure will be described below with reference to the drawings. In the following description and the drawings, the same components throughout the drawings are denoted by the same reference numerals. The same components are described with cross reference to the drawings, and redundant descriptions of the components denoted by the common reference numerals are omitted as appropriate.

A phrase "A is higher than B" used herein means that the distance between A and the principal surface of a semiconductor layer is longer than the distance between B and the principal surface. A phrase "A is lower than B" used herein means that the distance between A and the principal surface is shorter than the distance between B and the principal surface. The term "lower end of A" used herein refers to the one nearer the semiconductor layer of the two ends of A in the direction perpendicular to the principal surface. The term "upper end of A" used herein refers to the one opposite to the lower end of the two ends of A in the direction perpendicular to the principal surface. The term "lower surface of A" used herein refers to the one nearer the semiconductor layer of the two surfaces of A that intersects with (or is orthogonal to) the direction perpendicular to the principal surface. The term "upper surface of A" refers to the one opposite to the lower surface of the two surfaces of A that intersects with (or is orthogonal to) the direction perpendicular to the principal surface.

FIG. 1A is a plan view illustrating a configuration of a photoelectric conversion apparatus 930 according to a first exemplary embodiment. The photoelectric conversion apparatus 930 includes a light-receiving pixel region 101, a light-shielded pixel region 102, and a peripheral region 103. The light-receiving pixel region 101 is a region in which a plurality of photoelectric conversion portions (first photoelectric conversion portions) is disposed in a multi row and column form. In other words, the light-receiving pixel region 101 is a region in which a plurality of pixels forms a plurality of rows and a plurality of columns. In the light-receiving pixel region 101 and the light-shielded pixel region 102, the plurality of photoelectric conversion portions is disposed in a matrix. Signals from the first photoelectric conversion portions in each column of the light-receiving pixel region 101 are output through column signal lines. The light-shielded pixel region 102 is a region in which a plurality of photoelectric conversion portions shielded from light is disposed in a multi row and column form. In other words, the light-shielded pixel region 102 is a region in which a plurality of pixels shielded from light is disposed. The plurality of pixels shielded from light is used to provide an optical black (OB) level, and can be referred to as OB pixels. The light-shielded pixel region 102 may not be provided with photoelectric conversion portions 1072. If whether the photoelectric conversion portions 1072 is present or absent is not taken into consideration, the light-shielded pixel region 102 can be referred to as a light-shielded region. A buffer region including a pixel structure may be provided between the light-receiving pixel region 101 and the light-shielded pixel region 102. Each pixel in the light-receiving pixel region 101 and each pixel in the light-shielded pixel region 102 include circuit elements for outputting signals corresponding to electric charges generated in the photoelectric conversion portions to the outside of the pixels, as well as the photoelectric conversion portions.

The peripheral region 103 is located in the vicinity of the light-receiving pixel region 101 and the light-shielded pixel region 102. In the peripheral region 103, there can be disposed at least some of pad electrodes for inputting and outputting signals to and from an external apparatus and at least some of peripheral circuits. Examples of the peripheral circuits can include a row selection circuit, a readout circuit, and a column selection circuit. The plurality of photoelectric conversion portions disposed in the light-receiving pixel region 101 and the plurality of photoelectric conversion portions disposed in the light-shielded pixel region 102 can be disposed to form a photoelectric conversion array of a plurality of rows and a plurality of columns. The row selection circuit selects a row in the photoelectric conversion array, and drives the photoelectric conversion portions in the selected row. Signals from the photoelectric conversion portions in the selected row are output to the readout circuit through the column signal lines. The readout circuit reads out signals output to the column signal lines, and the column selection circuit sequentially selects and outputs the signals read out by the readout circuit from the column signal lines. Some or all of the above-described peripheral circuits may be provided in another semiconductor layer stacked on the semiconductor layer serving as a photoelectric conversion layer. In the peripheral region 103, there may be provided a connecting portion for connecting the semiconductor layer serving as the photoelectric conversion layer and another semiconductor layer. This connecting portion may be a bump electrode or a through electrode, wire bonding, or wiring through direct metal bonding.

Figure 1B:
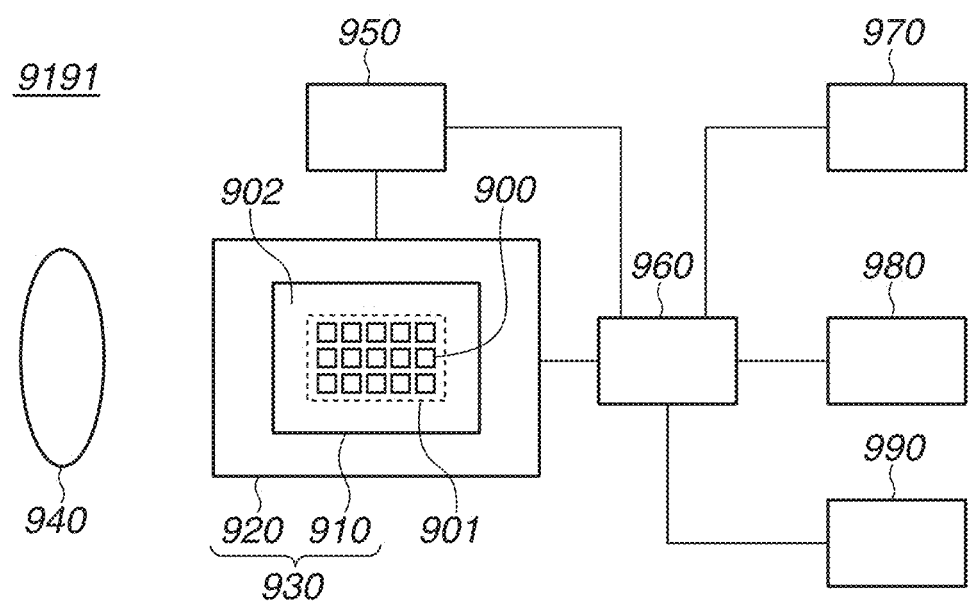
FIG. 1B is a schematic diagram illustrating the photoelectric conversion apparatus and equipment.

FIG. 1B is a schematic diagram illustrating equipment 9191 including the photoelectric conversion apparatus 930. The equipment 9191 including a semiconductor device will be described in detail. The photoelectric conversion apparatus 930 can include a semiconductor device 910 including a photoelectric conversion layer 104 and a package 920 that accommodates the semiconductor device 910. The package 920 can include a base to which the semiconductor device 910 is fixed, and a cover made of glass or other materials opposed to the semiconductor device 910. The package 920 can further include a bonding member, such as a bonding wire or a bump, that connects a terminal provided on the base to a terminal provided on the semiconductor device 910. The equipment 9191 can include at least one of an optical apparatus 940, a control apparatus 950, a processing apparatus 960, a display apparatus 970, a storage apparatus 980, or a mechanical apparatus 990. The equipment 9191 will be described in more detail below.

Figure 2A:
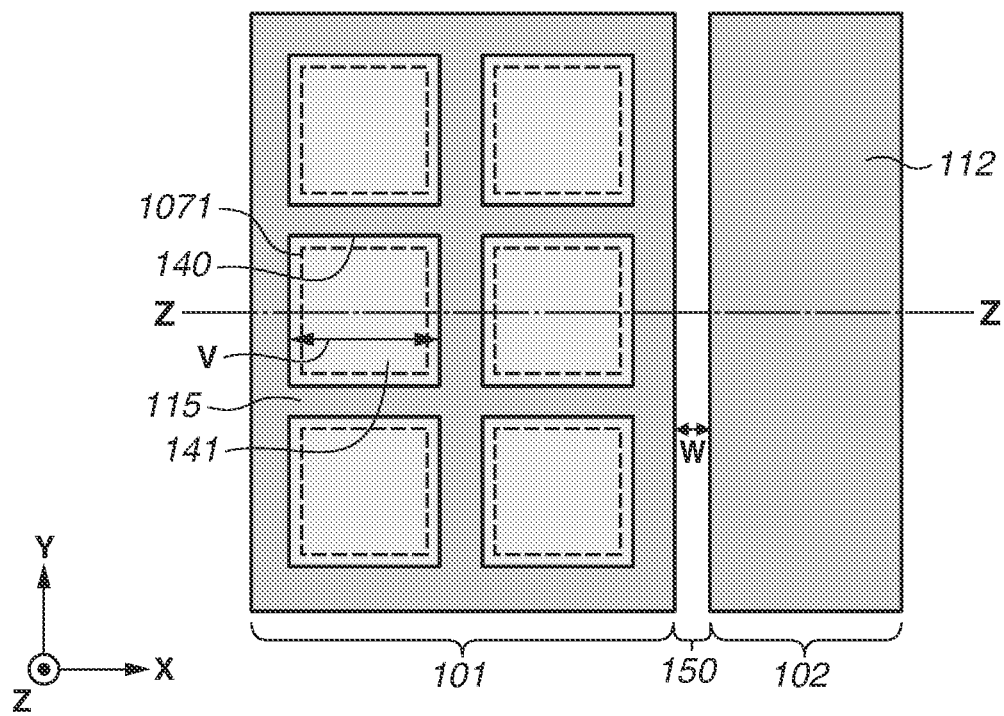
FIG. 2A is a plan view illustrating a portion including regions of the photoelectric conversion apparatus.
Figure 2B:
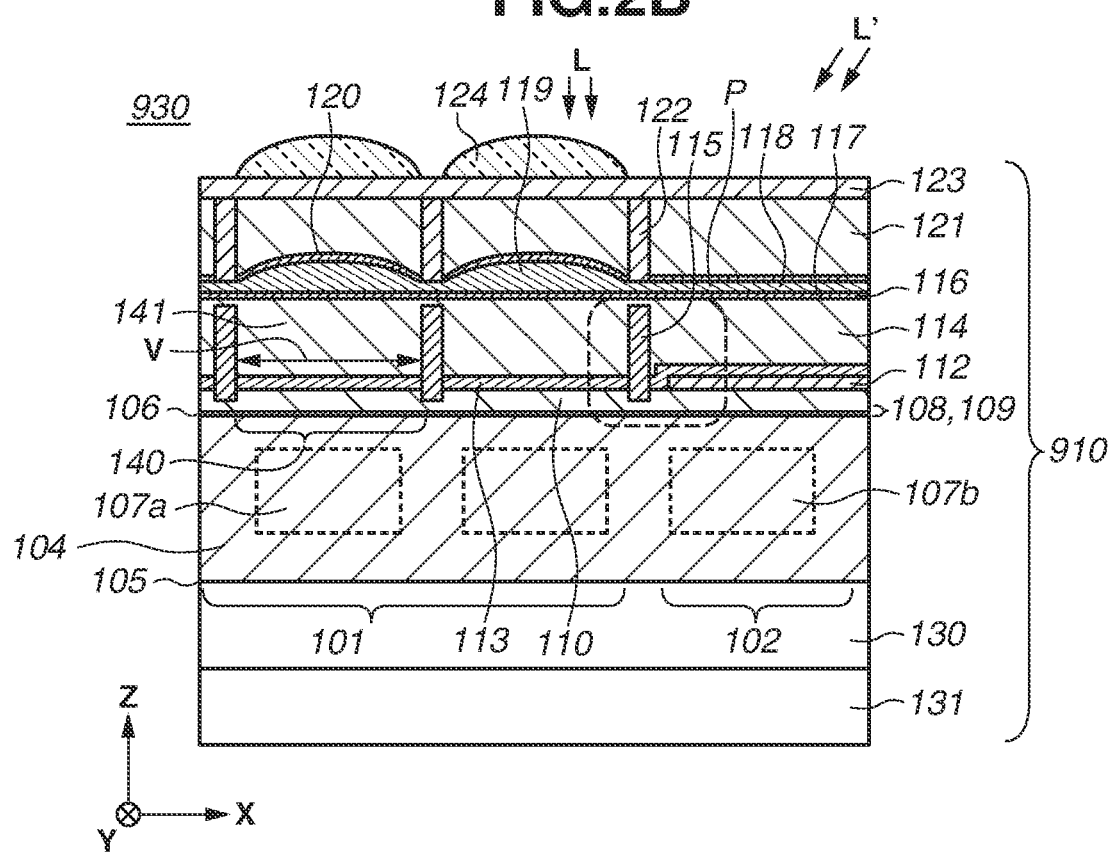
FIG. 2B is a schematic sectional view of the photoelectric conversion apparatus.

FIG. 2A is a plan view illustrating a portion including the light-receiving pixel region 101, the light-shielded pixel region 102, and a region between the light-receiving pixel region 101 and the light-shielded pixel region 102. FIG. 2B is a schematic sectional view of the photoelectric conversion apparatus 930 taken along a line Z-Z illustrated in FIGS. 1A and 2A.

The photoelectric conversion apparatus 930 includes the photoelectric conversion layer 104 including a plurality of photoelectric conversion portions 1071 and 1072. The photoelectric conversion apparatus 930 includes a light-shielding portion 115 provided over the photoelectric conversion layer 104 in the light-receiving pixel region 101. The light-shielding portion 115 is disposed to surround a light-transmitting portion 141. The light-transmitting portion 141 forms an optical path for light incident on each of the plurality of photoelectric conversion portions 1071 provided in the light-receiving pixel region 101.

The photoelectric conversion apparatus 930 includes a light-shielding film 112 disposed along the principal surface (back side 106) of the photoelectric conversion layer 104, over the photoelectric conversion layer 104 in the light-shielded pixel region 102.

The light-shielding portion 115 and the light-shielding film 112 are each formed of a metal layer or metallic compound layer made of a light-shielding material. Material examples of the metal layer can include aluminum, tungsten, tantalum, titanium, gold, silver, and copper. Material examples of the metallic compound layer can include a nitride or carbide of these metals. The main component of the metal layer included in the light-shielding portion 115 may be the same as or different from the main component of the metal layer included in the light-shielding film 112. For example, the light-shielding portion 115 may include a metal layer composed mainly of tungsten, and the light-shielding film 112 may include a metal layer composed mainly of aluminum. Aluminum has a higher extinction coefficient, a higher reflectance, and a higher absorptance than tungsten, which results in a lower transmittance. Thus, aluminum is suitably used as the main component of the metal layer included in the light-shielding film 112. The light-shielding portion 115 is formed by being buried in a long, deep groove, thereby reducing the width of the light-shielding portion 115 to achieve an enhanced sensitivity, in addition, thereby lengthening the length of the light-shielding portion 115 to provide an enhanced light-shielding performance. The grain size of tungsten can be easily made smaller than that of aluminum. Thus, tungsten is suitably used as the main component of the metal layer included in the light-shielding portion 115 buried in a long, deep groove.

The photoelectric conversion layer 104 can be a semiconductor layer such as a monocrystalline silicon layer or a compound semiconductor layer. Each photoelectric conversion portion 1071 can be a photodiode, such as a pn photodiode, a pin photodiode, or an avalanche photodiode, or a photogate. The photoelectric conversion layer 104 according to the present exemplary embodiment is provided with a transistor for reading out an electric charge from each photoelectric conversion portion 1071. The gate electrode of the transistor is provided on a surface 105 of the photoelectric conversion layer 104. The readout circuit can be disposed in another semiconductor layer stacked on the photoelectric conversion layer 104. In this case, the photoelectric conversion layer 104 may not be provided with a transistor. In other examples, the photoelectric conversion apparatus 930 may include a pixel electrode provided on the surface 105 and an opposed electrode provided on the back side 106 of the photoelectric conversion layer 104. In this case, the photoelectric conversion layer 104 can be a photoelectric conversion film made of an organic material and/or an inorganic material. The photoelectric conversion film may be a quantum dot film. Between the opposed electrode and the pixel electrode in the photoelectric conversion film is a photoelectric conversion portion.

As illustrated in FIG. 2A, an opening 140 defined by the light-shielding portion 115 and a gap 150 between the light-shielding portion 115 and the light-shielding film 112 are provided in a plane including the light-shielding film 112 and the light-shielding portion 115. A width W of the gap 150 in the X-direction in which the opening 140 and the gap 150 are arranged side by side is narrower than a width V of the opening 140 in the X-direction (W<V). The width V of the opening 140 is substantially equal to a pixel size, and can be set depending on the performance (sensitivity, the number of pixels, etc.) for the photoelectric conversion apparatus 930. The width W is, for example, in the range from 0.5 to 10 μm. The width W as narrow as possible may be suitable. The width W may be less than ½ of the width V (W<V/2), and the width W may be less than ¼ of the width V (W<V/4). The width W may be less than ⅛ of the width V (W<V/8). The width W may be, for example, in the range from 50 nm to 5 μm, and the width W may be less than 500 nm.

In the light-shielded pixel region 102, the light-shielding film 112 is covered with a dielectric film 113 that is a silicon nitride film. The dielectric film 113 extends in the light-receiving pixel region 101. The light-shielding portion 115 penetrates through the dielectric film 113. Thus, in a plane including the light-shielding film 112 and the light-shielding portion 115, the dielectric film 113, which is a silicon nitride film, is provided in addition to the light-shielding film 112 and the light-shielding portion 115.

Over each light-transmitting portion 141, a micro lens 124 and an interlayer lens 119 are provided. The interlayer lens 119 is located between the micro lens 124 and the light-transmitting portion 141. A color filter 123 is provided between the interlayer lens 119 and the micro lens 124. The photoelectric conversion apparatus 930 is a back-side illumination photoelectric conversion apparatus that includes a wiring structure portion 130 provided at the opposite side of the photoelectric conversion layer 104 from the light-shielding film 112.

The positional relationship between the light-shielding film 112 and the light-shielding portion 115 will be described in detail with reference to FIG. 3. The light-shielding portion 115 includes a lower end 811, which is an end nearer the photoelectric conversion layer 104 in the Z-direction perpendicular to the principal surface (back side 106) of the photoelectric conversion layer 104, and an upper end that is an end opposite to the lower end 811 of the light-shielding portion 115 in the Z-direction. The light-shielding portion 115 includes a side surface 810 that is a surface nearer the light-shielding film 112. The light-shielding portion 115 includes a side surface 830 that is a surface opposite to (adjacent to the light-transmitting portion 141) the light-shielding film 112. The lower end 811 is an end of the side surface 810, nearer the photoelectric conversion layer 104. An upper end 812 is an end of the side surface 810, opposite to (upper side) the photoelectric conversion layer 104 (lower side).

The light-shielding film 112 has a lower surface 840, a surface nearer the photoelectric conversion layer 104 in the Z-direction, and an upper surface 860, a surface opposite to the photoelectric conversion layer 104 in the Z-direction. The light-shielding film 112 has a side surface 820, a surface nearer the light-shielding portion 115. The lower end of the side surface 820, nearer the photoelectric conversion layer 104, is a lower end 821. The upper end of the side surface 820, opposite to the photoelectric conversion layer 104 (lower), is an upper end 822.

A distance C between the upper end 812 of the light-shielding portion 115 and the photoelectric conversion layer 104 is longer than a distance A between the lower surface 840 of the light-shielding film 112 and the photoelectric conversion layer 104 (C>A). The distance between the lower end 811 of the light-shielding portion 115 and the photoelectric conversion layer 104 is denoted by D. The distance D is shorter than the distance A (D<A).

The distance between the upper surface 860 of the light-shielding film 112 and the photoelectric conversion layer 104 is denoted by B. In the present exemplary embodiment, the distance C is longer than the distance B (C>B). However, the distance C may be equal to or shorter than the distance B (C≤B).

The width W of the gap 150 is a distance between the lower end 811 and the upper end 822 in the X-direction. The lower end 811 and the upper end 822 are located at different positions in the Z-direction, while the distance between the two ends in the X-direction is focused on the components in the X-direction. The distance between the lower end 811 and the upper end 812 in the Z-direction is represented by C−D. The distance C−D corresponds to the length of the light-shielding portion 115 in the Z-direction. The distance between the lower surface 840 (lower end 821) and the upper surface 860 (upper end 822) in the Z-direction is represented by B−A. The distance B−A corresponds to the thickness of the light-shielding film 112 in the Z-direction. The distance D corresponds to the height of the lower end 811 from the back side 106. The distance D can be less than 200 nm. The distance between the lower end 811 and the upper end 822 in the Z-direction is represented by T. The sum of the distance D and the distance T equals the distance B (D+T=B). The distance B corresponds to the height of the upper end 822 from the back side 106.

Figure 3:
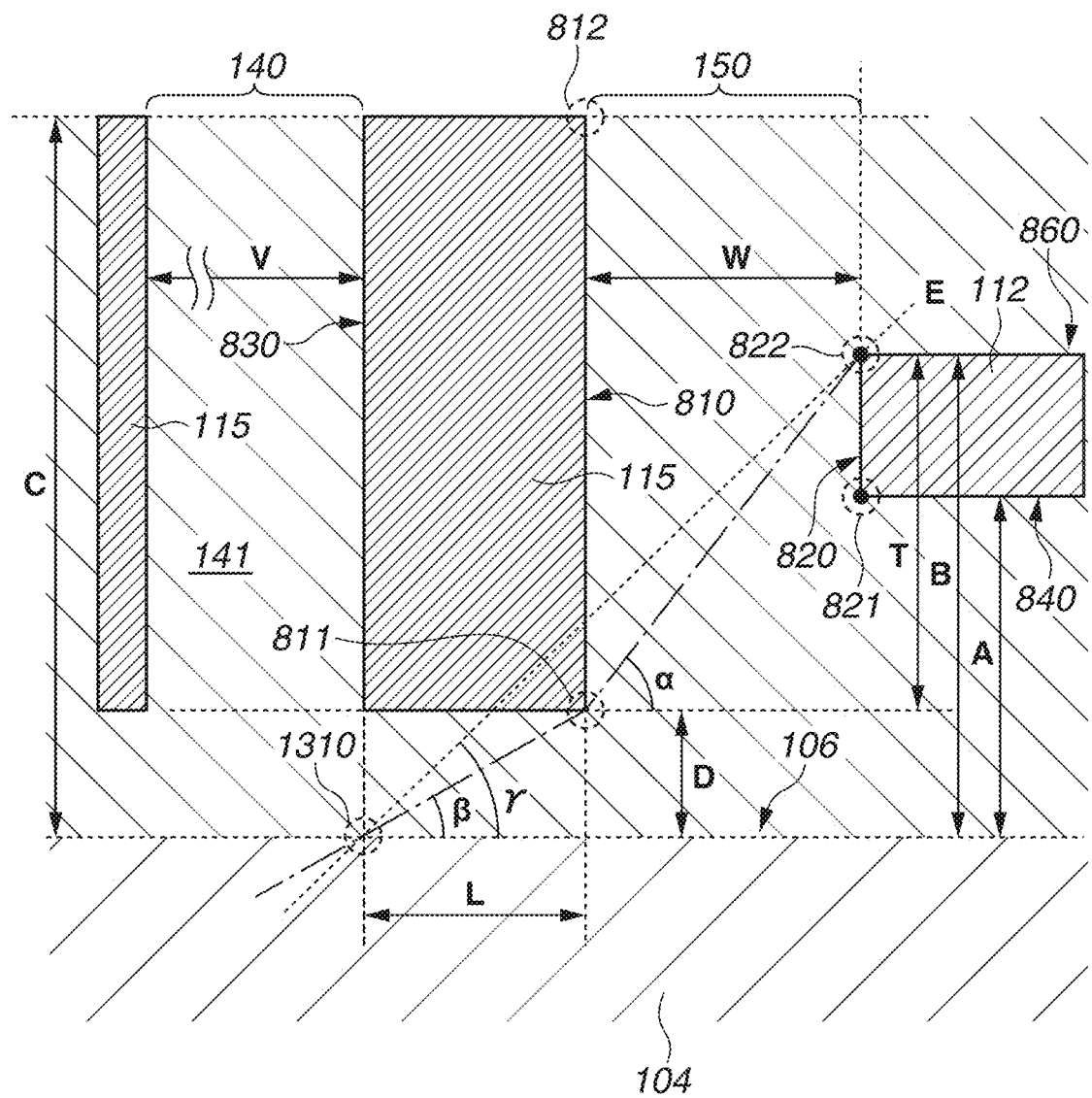
FIG. 3 is a schematic diagram illustrating the photoelectric conversion apparatus.

In FIG. 3, the straight line connecting the lower end 811 and the upper end 822 is represented by a dashed-dotted line. The angle α is formed between the dashed-dotted line and the back side 106. As seen in FIG. 3, tan α=T/W.

A location under the lower end of the side surface 830 is represented by a border 1310. The border 1310 is located under the boundary between the light-shielding portion 115 and the light-transmitting portion 141. A width L of the light-shielding portion 115 in the X-direction matches a distance L between the lower end 811 and the border 1310 in the X-direction. A distance between the lower end 811 and the border 1310 in the Z-direction is the distance D. The lower end 811 and the border 1310 are located at different positions in the Z-direction and the X-direction. However, the distance between the two positions in the X-direction is focused on the components in the X-direction, and the distance between the two portions in the Z-direction is focused on the components in the Z-direction.

In FIG. 3, the straight line connecting the lower end 811 and the border 1310 is represented by an alternate long and two short dashes line. An angle β is formed between the alternate long and two short dashes line and the back side 106. As seen from FIG. 3, tan β=D/L.

Assume here that a light beam is incident with a predetermined angle along a long dashed line E from the outside of the opposite side of the light-shielding portion 115 from the light-transmitting portion 141. The long dashed line E is a line connecting the upper end 822 and the border 1310. An angle γ is formed between the long dashed line E and the back side 106.

Assume a case where the light-shielding portion 115 is not present within the range of the distance A from the back side 106. Incoming light with an angle larger than the angle γ passing by the upper end 822 can be incident on a portion of the back side 106 under the light-shielding portion 115. On the other hand, incoming light with an angle lower than the angle γ passing by the upper end 822 can be incident on a portion of the back side 106 under the light transmitting portion 141, beyond the back side 106 under the light-shielding portion 115. Thus, light incident in the lower portion of the light-transmitting portion 141 causes optical noise, such as crosstalk, in photoelectric conversion, the light of which is to be blocked as much as possible. To block the light, the lower end 811 is positioned below the long dashed line E. Positioning the lower end 811 below the long dashed line E satisfies α>β or γ>β. This can be geometrically understood from FIG. 3.

The condition α>β will now be considered. When α>β, tan α>tan β is satisfied. As described above, as tan α=T/W and tan β=D/L, T/W>D/L is satisfied. Since B=T+D, T=B−D. By substituting this expression into T/W>D/L and rewriting the obtained expression, B/D>(W+L)/L is derived. By rewriting B/D>(W+L)/L, W/L<(B−D)/D is obtained.

The condition γ>β will now be considered. When γ>β, tan γ>tan β is satisfied. Since tan γ=B/(L+W) and tan β=D/L, B/(L+W)>D/L. By rewriting this expression, B/D>(W+L)/L can be derived. By rewriting B/D>(W+L)/L, W/L<(B−D)/D can be obtained.

Thus, satisfying B/D>(W+L)/L will lead to prevention of light from being incident in the portion under the light-transmitting portion 141. Since the fractional denominator is not "0", the above-described expression is satisfied when D>0 and L>0. In the expression L/(W+L)>D/B, when L>0 holds, the expression can be satisfied even when D=0.

To obtain higher optical characteristics (light-shielding performance), it is suitable to set the distance D and the distance W to be as short as possible, and to set the distance L, the distance T, and the distance B to be as long as possible.

For the light-shielding performance of the light-receiving pixel region 101, the shorter the distance D, the more crosstalk between adjacent light-receiving pixels can be reduced. Thus, it is suitable to satisfy D<W. Further, it is suitable to satisfy D<W/2 for advantage of blocking the light more.

Light incident into the lower portion of the light-transmitting portion 141 from the gap 150 can be reduced more as the distance W decreases and/or as the distance B increases. Hence, it is suitable to satisfy W<B.

For the light-receiving performance in the light-receiving pixel region 101, the sensitivity can be increased with a wider width V of the opening 140 as the distance L decreases. Hence, the distance L as short as possible is suitable, for example, to satisfy L<B.

For the light-shielding performance in the light-receiving pixel region 101, crosstalk between adjacent light-receiving pixels can be reduced as the distance L increases. A narrower distance W allows the light incident from the gap 150 to be reduced. As a consequence, it is suitable to satisfy W<L. However, in some cases with difficulty providing the light-shielding portion 115 greatly near the light-shielding film 112, L<W can be set. For example, as illustrated in FIG. 2B, the dielectric film 113 covering the side surface 820 of the light-shielding film 112 creates a step in the dielectric film 113. In order to form the light-shielding portion 115, the light-shielding portion 115 is located away from the step on the dielectric film 113. The width of the step in the X-direction depends on the thickness of the dielectric film 113. The thickness of the dielectric film 113 is typically thinner than the thickness of the light-shielding film 112. Thus, the width of the step in the X-direction can be set to be not more than the distance T. Hence, when T<W, the light-shielding portion 115 can be formed at a position where the light-shielding portion 115 is less affected by the step in the dielectric film 113. Since T=B−D, it is suitable to satisfy B−D<W. Therefore, it is suitable to satisfy W<L and/or B−D<W.

In view of the foregoing, a typical relationship is D<L and W<A<T<B<C<V. The distance D is, for example, in the range from 50 to 200 nm. The distance L is, for example, in the range from 100 to 400 nm. The distance W is, for example, in the range from 100 to 400 nm. The distance A is, for example, in the range from 100 to 500 nm. The distance T is, for example, in the range from 200 to 800 nm. The distance B is, for example, in the range from 200 to 1000 nm.

The photoelectric conversion apparatus 930 includes a substrate 131, such as a supporting substrate or a circuit board, and the photoelectric conversion layer 104 is disposed above the substrate 131. The wiring structure portion 130 is between the substrate 131 and the photoelectric conversion layer 104. The photoelectric conversion layer 104 has the surface 105, nearer the wiring structure portion 130, and the back side 106, a light incident side. The photoelectric conversion layer 104 includes the photoelectric conversion portions 1071 in the light-receiving pixel region and the photoelectric conversion portions 1072 in the light-shielded pixel region 102. The back side 106 is provided with a dielectric layer 108 and an anti-reflection film 109. The light-shielding film 112 is formed in the light-shielded pixel region 102, and a dielectric layer 110 is provided between the anti-reflection film 109 and the light-shielding film 112. Further, the dielectric film 113 is provided to cover the light-shielding film 112, and a dielectric film 114 is provided to cover the dielectric film 113. As illustrated in FIG. 2B, which is a sectional view taken along the line Z-Z, the light-shielding portion 115 surrounding each pixel is provided in the dielectric film 114. The structure of surrounding each pixel prevents occurrence of crosstalk between adjacent pixels. The incident light enters the photoelectric conversion layer 104 through the back side 106. In FIG. 2B, for a simple illustration, normal incident light and oblique-incident light are represented by arrows L and respectively.

Along with the recent trend toward shorter exit pupil distances of cameras, i.e., with increasing incidence angles of wide-angle lenses, crosstalk is more likely to occur. For this reason, crosstalk is found in the light-receiving pixel region 101. There is another issue that a dark current that flows into the light-shielded pixel region 102 increases. The light-shielding portion 115 that prevents occurrence of crosstalk in the light-receiving pixel region 101 is disposed at a position lower than the light-shielding film 112 in the light-shielded pixel region 102. As a result, light obliquely incident from above the light-shielded pixel region 102 with a large angle enters between the light-shielding film 112 and the light-shielding portion 115, which prevents occurrence of crosstalk, in the light-receiving pixel region 101, and then reaches a light-receiving portion of a pixel adjacent to a light-shielded pixel. As a result, light signals may not be correctly detected at light-receiving portions in the light-receiving pixel region 101 at the boundary between the light-receiving pixel region 101 and the light-shielded pixel region 102. According to the present exemplary embodiment, a well devised layout of the light-shielding film 112 and the light-shielding portion 115 can prevent crosstalk from occurring due to stray light in the light-receiving pixel region 101 and simultaneously prevent increase in dark current in the light-shielded pixel region 102, providing higher quality images.

An example of a manufacturing process for the photoelectric conversion apparatus will be described with reference to FIGS. 4A to 4C and FIGS. 5A to 5C.

Figure 4A:
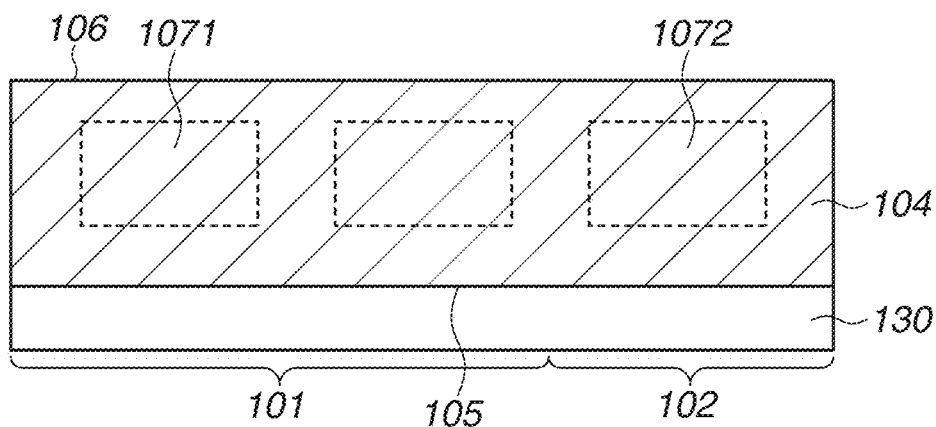
FIGS. 4A to 4C are schematic diagrams each illustrating a manufacturing process for the photoelectric conversion apparatus.

In step A illustrated in FIG. 4A, a member including the wiring structure portion 130 and the photoelectric conversion layer 104 with an adjusted thickness is formed. The photoelectric conversion layer 104 has the surface 105 nearer the substrate and the back side 106, which is the light incident side. The thickness of the photoelectric conversion layer 104 is in the range from 1 to 10 µm, and typically, in the range from 1 to 5 µm, for example, about 3 µm. The thickness of the photoelectric conversion layer 104 may be varied depending on the wavelength of an object to be detected. In addition, the photoelectric conversion layer 104 has the plurality of photoelectric conversion portions for performing photoelectric conversion in it, which are the photoelectric conversion portions 1071 in the light-receiving pixel region 101 and the photoelectric conversion portions 1072 in the light-shielded pixel region 102.

Figure 4B:
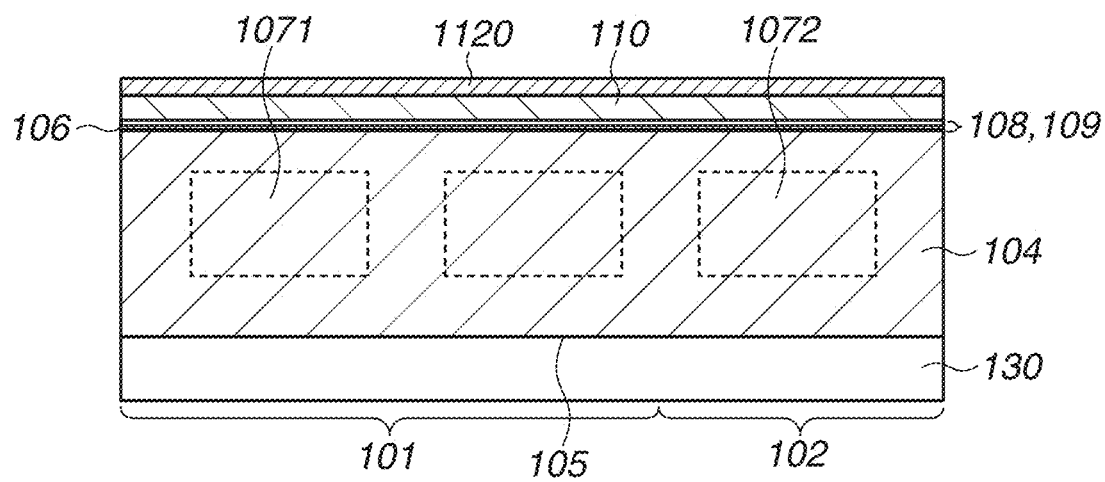

In step B illustrated in FIG. 4B, the dielectric layer 108 is formed on the back side 106 and then the dielectric layer 109 that functions as an anti-reflection film is formed. The dielectric layer 108 can be a metallic oxide layer such as an aluminum oxide or a hafnium oxide. The dielectric layer 109 can be a metallic oxide layer such as a tantalum oxide or a titanium oxide. The dielectric layer 110 can be a planarization layer for providing the back side 106 with higher flatness, or an interlayer insulating layer from the photoelectric conversion layer 104. Further, in step B, a light-shielding material film 1120 is formed over the dielectric layer 110. The light-shielding material film 1120 can include a metal layer made of, for example, aluminum or tungsten. The light-shielding material film 1120 may be a multi-layered film of a plurality of metal layers and/or metallic compound layers. An opening (not illustrated) can be formed in the dielectric layer 108, the dielectric layer 109, and/or the dielectric layer 110. Through this opening, the light-shielding film 112 and the photoelectric conversion layer 104 may be electrically connected at a position (not illustrated), supplying a predetermined electric potential to the light-shielding film 112 to thereby prevent the potential of the light-shielding film 112 from being put into an electrically-floating condition.

Figure 4C:
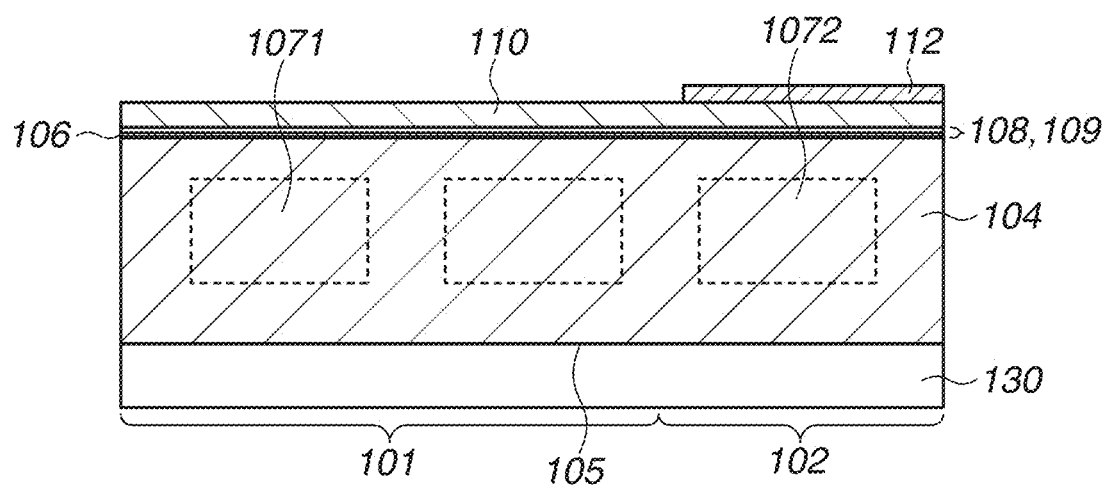

In step C illustrated in FIG. 4C, the whole or a partial light-shielding material film 1120 in the light-receiving pixel region 101 is removed by a method such as photolithography and dry etching. In addition the light-shielding material film 1120 is patterned so that the light-shielding film 112 that covers the light-shielded pixel region 102 is left.

Figure 5A:
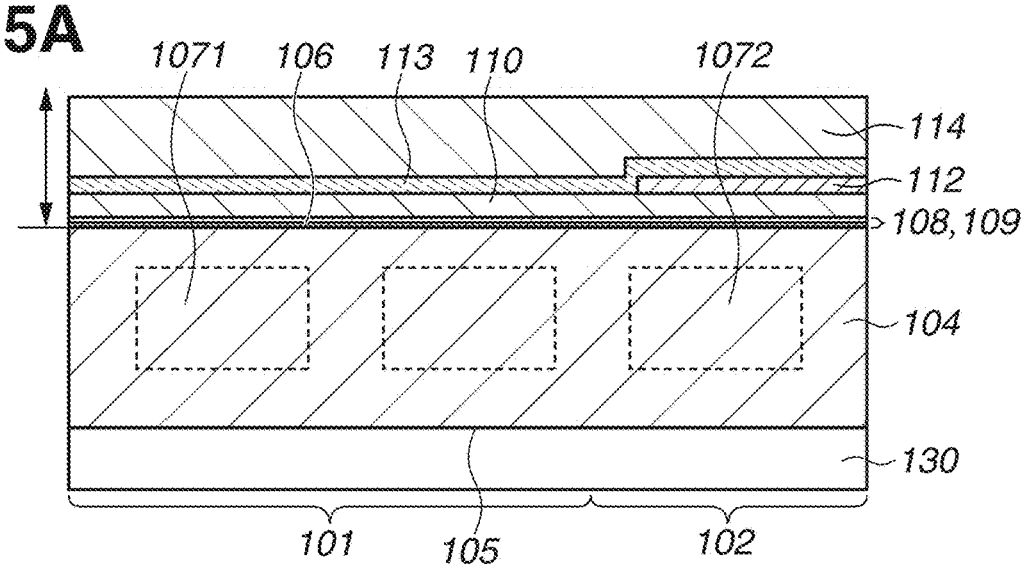
FIGS. 5A to 5C are schematic diagrams each illustrating a manufacturing process for the photoelectric conversion apparatus.

In step D illustrated in FIG. 5A, the dielectric film 113 and the dielectric film 114 are formed to cover the light-shielding film 112 and the dielectric layer 110, and then a planarization process is performed.

Figure 5B:
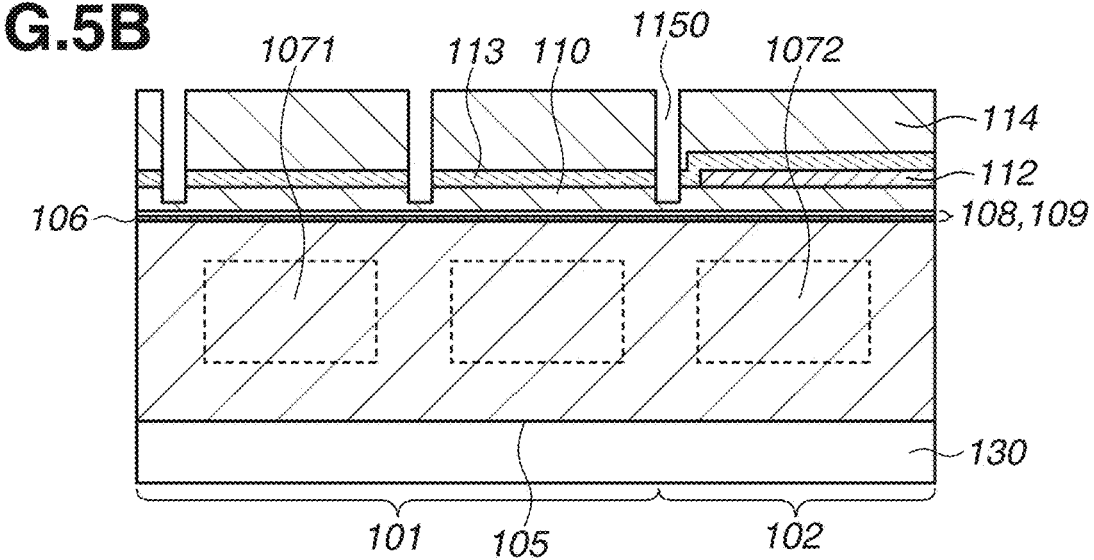

In step E illustrated in FIG. 5B, a groove 1150 is formed in the dielectric film 113 and the dielectric film 114 so that the groove 1150 surrounds each pixel in the light-receiving pixel region 101. The portion surrounded by the groove 1150 in the dielectric films 113 and 114 can be the light-transmitting portion 141.

Figure 5C:
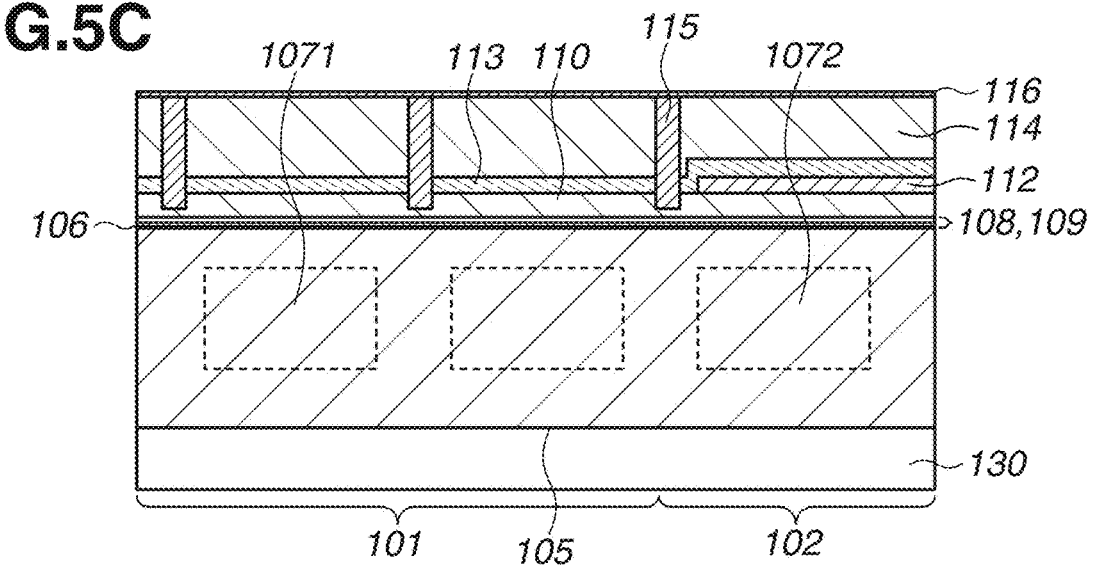

In step F illustrated in FIG. 5C, a light-shielding material film is formed in the groove 1150, and an extra portion of the light-shielding material film that is located outside the groove 1150 is removed by a chemical mechanical planarization (CMP) method or another method. The light-shielding material film can include a metal layer made of, for example, tungsten. The light-shielding material film 1120 may be a multi-layered film including a plurality of metal layers and/or metallic compound layers. Thus, the light-shielding portion 115 is formed from the light-shielding material film. The light-shielding portion 115 can be disposed to surround the light-transmitting portion 141 over each photoelectric conversion portion 1071.

In step F illustrated in FIG. 5C, an insulating film 116 is formed as a protective film over the upper portion of the light-shielding portion 115.

After that, in step G (not illustrated), a plurality of interlayer lenses 119 each including a light-transmitting film 117 and a dielectric film 118 is formed. First, a material film that constitutes the light-transmitting film 117 is formed to cover the insulating film 116, and the dielectric film 118 is further formed thereon. The material film of the light-transmitting film 117 can be formed of a dielectric film, such as an oxide silicon film or a silicon oxynitride film. In other words, the material film can be formed of a compound including silicon and oxygen. Then, an etching mask pattern is formed in the material film, and the etching mask pattern may be processed. For example, heating the etching mask pattern causes curved surfaces to be transferred onto the base material film to be formed. Then, the material film is partially etched with the etching mask, which transfers the curved surfaces onto the material film, which makes it possible to form the plurality of interlayer lenses 119. An anti-reflection film 120, which can be formed of an oxide silicon film, a silicon oxynitride film, or another similar film, can be placed over the interlayer lenses 119. The upper surface of each interlayer lens 119 forms in a convex shape toward the light L to enter, and each interlayer lens 119 can be aligned with the corresponding photoelectric conversion portion 1071.

In step H (not illustrated), an insulating film 121 is formed over the elements forming the interlayer lens 119, and then the planarization process is performed. Further, each opening is formed in the insulating film 121 and the anti-reflection film 120 so that the opening surrounds each pixel in the light-receiving pixel region 101, and a metallic film is formed at the opening to thereby provide a light-shielding portion 122. The metallic film formed at the light-shielding portion 122 can be, for example, a metallic film made of tungsten. After the metallic film is formed, the planarization process is performed. Further, a protective film similar to the insulating film 116 located at the uppermost portion of the light-shielding portion is formed.

In step I (not illustrated), the color filter 123 is formed over the insulating film, and then the micro lenses 124 are formed on the color filter 123. In this manner, the photoelectric conversion apparatus 930 illustrated in FIG. 2B can be obtained.

Figure 6A:
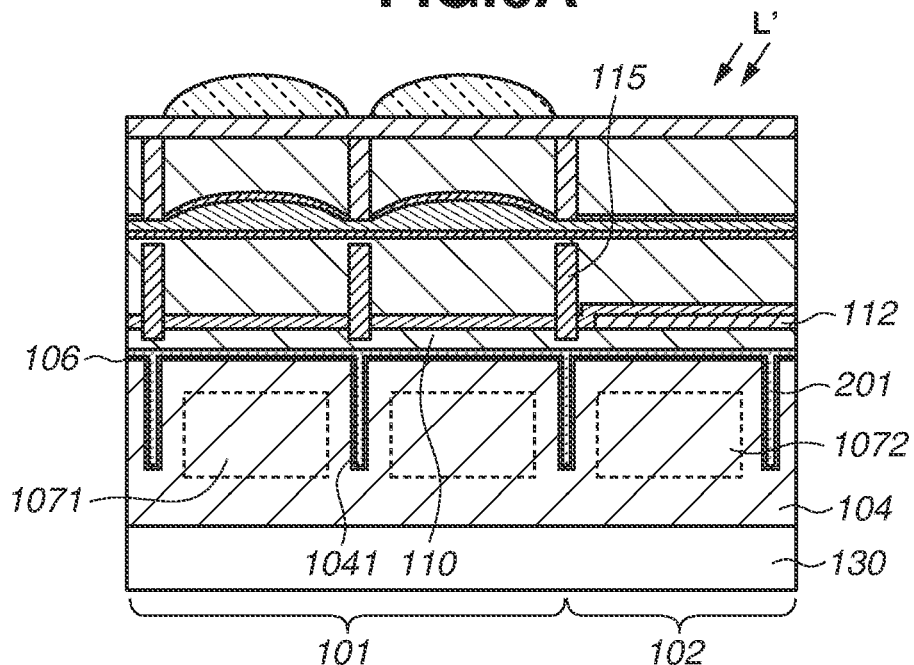
FIGS. 6A and 6B are schematic sectional views each illustrating the photoelectric conversion apparatus.

FIG. 6A is a sectional view illustrating the photoelectric conversion apparatus 930 according to a second exemplary embodiment. In the second exemplary embodiment, the photoelectric conversion layer 104 is provided with separating portions 201. The photoelectric conversion layer 104 in the light-receiving pixel region 101 is provided with a groove 1041 between the first photoelectric conversion portions 10711 and the second photoelectric conversion portions 10712 of the plurality of photoelectric conversion portions provided in the photoelectric conversion layer 104. The separating portions 201 are each provided in the groove 1041. The arrangement of the separating portions 201 makes it possible to prevent the leakage of light into the light-receiving pixel region 101 even with a low angle of incidence of the oblique-incident light L' from the light-shielded pixel region 102 illustrated in FIG. 2B. The separating portions 201 can prevent the leakage of light into the regularly arranged photoelectric conversion portions 1071, and can also have an effect of electrically separating the adjacent pixels in the photoelectric conversion layer 104. For higher light-shielding performance, the separating portions 201 may be disposed under the light-shielding portion 115.

To form the separating portions 201, after step A described above in the first exemplary embodiment, a groove is formed in the back side 106 of the photoelectric conversion layer 104, the groove of which surrounds the photoelectric conversion portions 1071 and 1072, and then step B is carried out. In step B, after the dielectric layer 108 and the dielectric layer 109 are formed, metal may be further buried to form a reflecting structure or a light-shielding structure between the adjacent pixels.

Figure 6B:
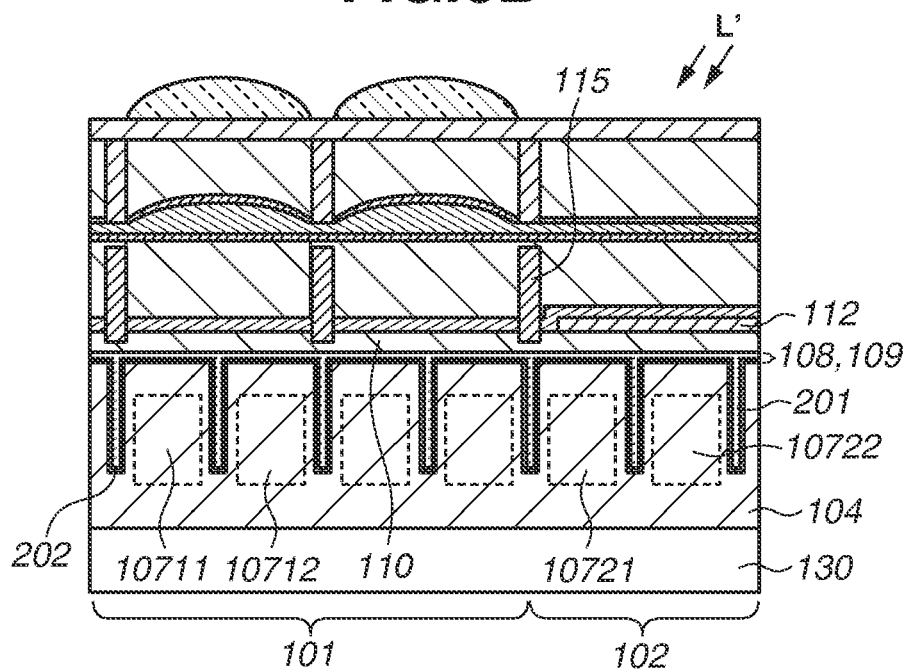

FIG. 6B is a sectional view illustrating the photoelectric conversion apparatus 930 according to a third exemplary embodiment. In the third exemplary embodiment, a plurality of photoelectric conversion portions 10711 and 10712 is provided in a single light-receiving pixel. Two or more photoelectric conversion portions may be provided under the light-transmitting portion 141. This configuration enables focus detection, ranging, and dynamic range enlargement. Further, a plurality of photoelectric conversion portions 10721 and 10722 is provided in a single light-shielded pixel. A common color filter and/or a common micro lens is provided over the plurality of photoelectric conversion portions 10711 and 10712 in a single pixel. In addition, separation portions 202 may be provided between divided photoelectric conversion portions in each of the regularly arranged photoelectric conversion portions 1071 and 1072 for applications such as autofocus functionality.

Figure 7A:
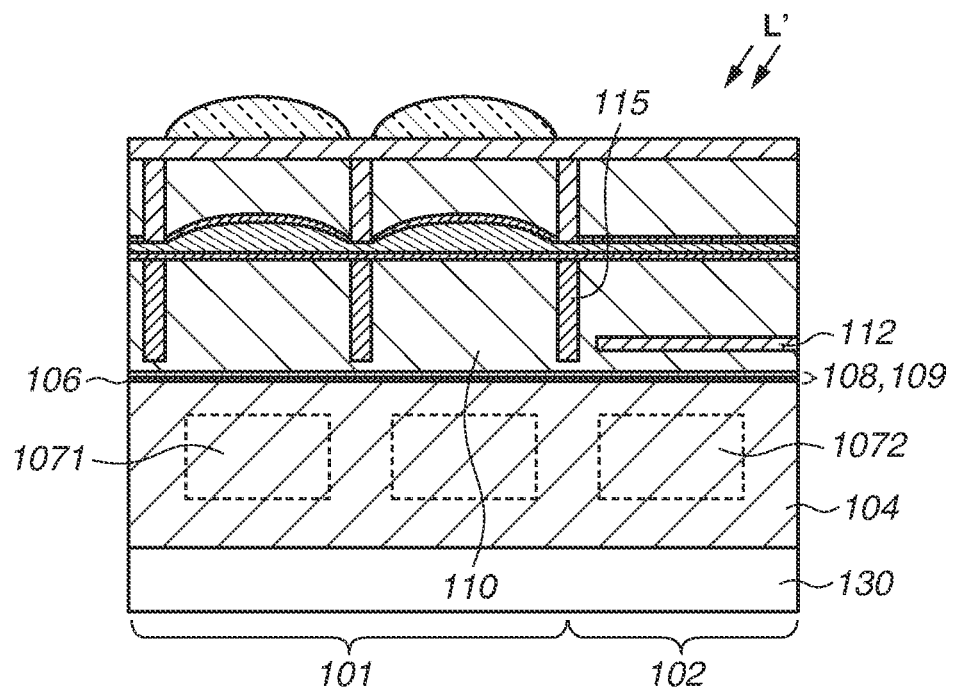
FIGS. 7A and 7B are schematic sectional views each illustrating the photoelectric conversion apparatus.

FIG. 7A is a sectional view illustrating the photoelectric conversion apparatus 930 according to a fourth exemplary embodiment. In the fourth exemplary embodiment, no dielectric film 113 covers the light-shielding film 112. To form the groove 1150, which is formed through etching process, for the light-shielding portion 115, employing a film such as an oxide silicon film as both the dielectric layer 110 and the dielectric film 114, without the dielectric film 113, facilitates the process of the groove 1150.

Figure 7B:
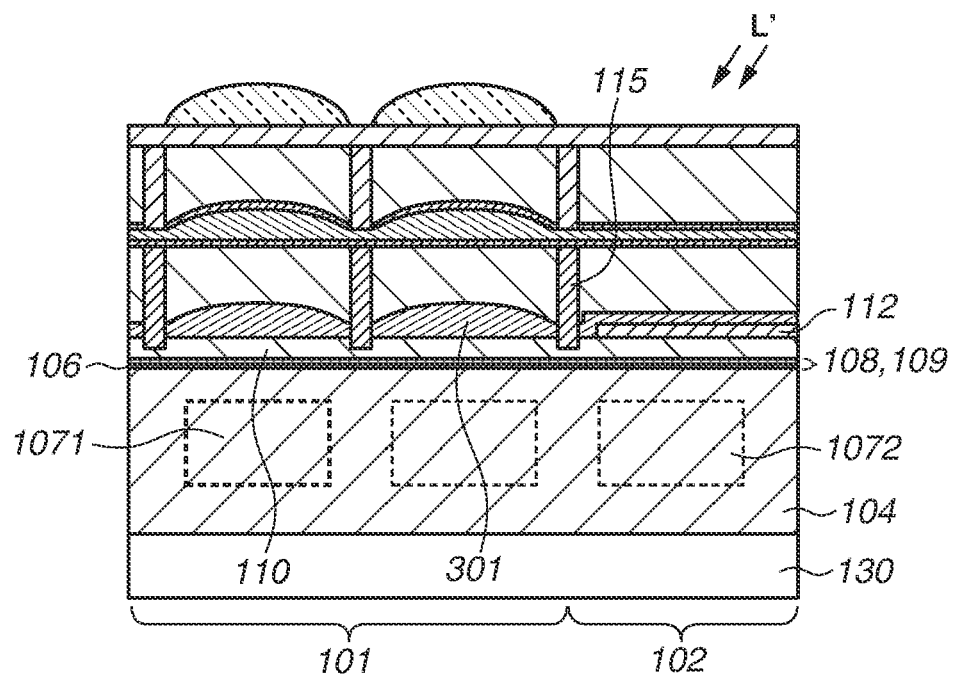

FIG. 7B is a sectional view illustrating the photoelectric conversion apparatus 930 according to a fifth exemplary embodiment. In the fifth exemplary embodiment, the dielectric film 113 includes a lens portion 301 as an interlayer lens. Although not illustrated, an anti-reflection film may be layered over the interlayer lens, as in the first exemplary embodiment.

Figure 8A:
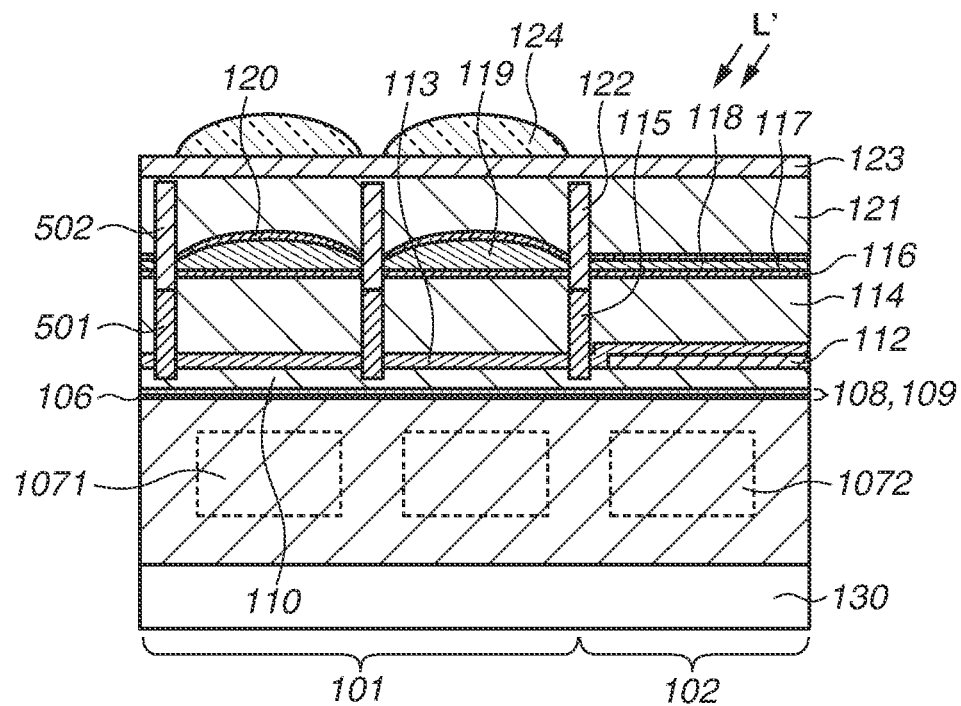
FIGS. 8A and 8B are schematic sectional views each illustrating the photoelectric conversion apparatus.

FIG. 8A is a sectional view illustrating the photoelectric conversion apparatus 930 according to a sixth exemplary embodiment. The sixth exemplary embodiment differs from the first exemplary embodiment in that the light-shielding portion 115 according to the first exemplary embodiment includes a lower light-shielding portion 501 and an upper light-shielding portion 502 formed over the light-shielding portion 501. In the first exemplary embodiment, there is a gap between the uppermost portion of the light-shielding portion 115 and the lowermost portion of the light-shielding portion 122 directly above the light-shielding portion 115. In the sixth exemplary embodiment, this gap is eliminated. The presence of this gap creates a similar relationship to the relationship caused by the distance D between the back side 106 and the lowermost portion of the light-shielding portion 115 illustrated in FIG. 3 according to the first exemplary embodiment. If the gap is wide, it is highly likely that the oblique-incident light U from the light-shielded pixel region 102 enters the light-receiving pixel region 101. No gap provided between the uppermost portion of the light-shielding portion 115 and the lowermost portion of the light-shielding portion 122 allows the possibility of the entrance of the oblique-incident light U to be eliminated. For light shielding performance, it is suitable to eliminate the distance between the uppermost portion of the light-shielding portion 115 and the light-shielding portion 122. The manufacturing process according to the present exemplary embodiment can be achieved by forming an opening deepened in the range down to a position, at most, of the uppermost portion of the light-shielding portion 115 as the bottom in the formation of the groove for forming the light-shielding portion 122, without using the insulating film 116 formed in step F. In another process, a groove for forming both the light-shielding portion 115 and the light-shielding portion 122 can be integrally formed, without forming the light-shielding portion 115.

Figure 8B:
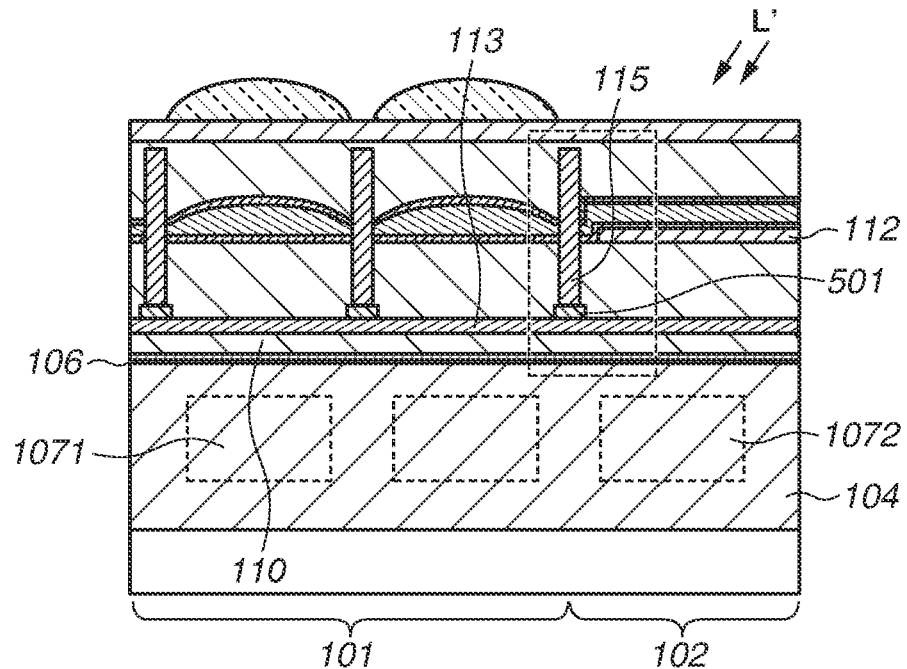

FIG. 8B is a sectional view illustrating the photoelectric conversion apparatus 930 according to a seventh exemplary embodiment. The seventh exemplary embodiment differs from the first exemplary embodiment in regard to the layout position of the light-shielding film 112 and the shape for improving the light-shielding performance of the light-shielding portion 115. In the seventh exemplary embodiment, the light-shielding portion 115 in the light-receiving pixel region 101 includes the upper light-shielding portion 502 and the lower light-shielding portion 501 located between the upper light-shielding portion 502 and the photoelectric conversion layer 104. The lower light-shielding portion 501 has the lower end 811 illustrated in FIG. 3, and the upper light-shielding portion 502 has the upper end 812 illustrated in FIG. 3. The width of the upper light-shielding portion 502 is narrower than that of the lower light-shielding portion 501. Thus, the upper light-shielding portion 502 having a narrower width provides a higher sensitivity, and the upper light-shielding portion 502 having a larger width provides a higher light-shielding performance.

Figure 9A:
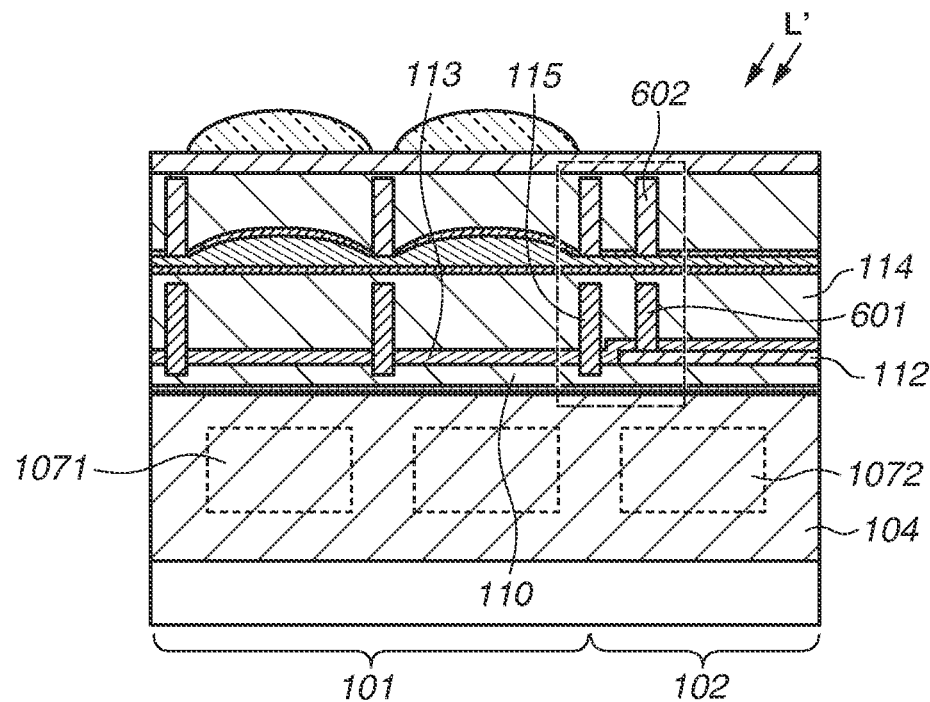
FIGS. 9A and 9B are schematic sectional views each illustrating the photoelectric conversion apparatus.

FIG. 9A is a sectional view illustrating the photoelectric conversion apparatus 930 according to an eighth exemplary embodiment. In the eighth exemplary embodiment, a light-shielding portion 601 made of the same material as the light-shielding portion 115 is provided on the light-shielding film 112. The light-shielding portion 601 consists of the light-shielding portion 115 placed on the light-shielding film 112. Further, the formation of the light-shielding portion 601 and a light-shielding portion 602 prevents the leakage of light from the upper portion of the light-shielded pixel region 102.

Figure 9B:
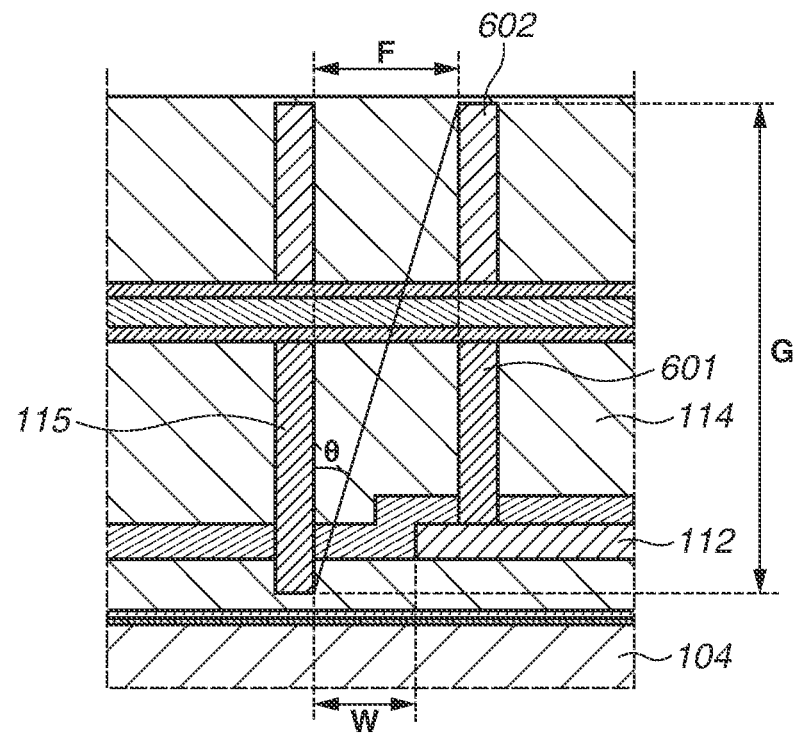

FIG. 9B is an enlarged view illustrating a portion indicated in a dotted box in FIG. 9A. The light-shielding portion 601 and the light-shielding portion 602 are disposed with a narrow angle θ formed between the shortest straight line that connects the uppermost portion of the light-shielding portion 602 and the lowermost end of the light-shielding portion 115 and the side wall of the light-shielding portion 115 that is nearer the light-shielded pixel region 102. Let a distance F be a horizontal distance from the side wall of the light-shielding portion 115 that is nearer the light-shielded pixel region 102 to the side wall of the light-shielding portion 602 that is nearer the light-receiving pixel region 101 and let a distance G be a vertical distance from the lowermost portion of the light-shielding portion 115 to the uppermost portion of the light-shielding portion 602, the angle θ can be expressed by the following.

$$\theta = \arctan(F/G)$$

Assuming that the vertical length of the light-shielding portion 115 and the light-shielding portion 122 is about 1700 nm, the horizontal distance F can be made much shorter than the vertical distance G, the angle θ becoming about 1°. The light-shielding portion 601 and the light-shielding portion 602 can be formed simultaneously with the light-shielding portion 115 and the light-shielding portion 122.

Figure 10A:
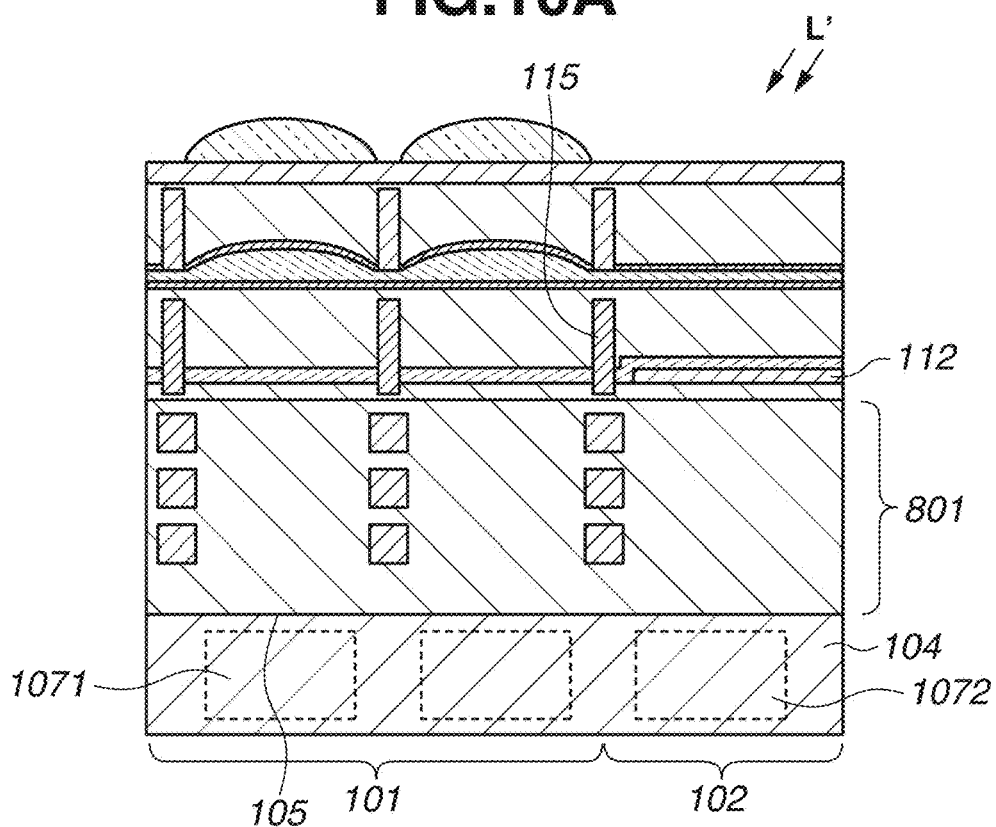
FIGS. 10A to 10C are schematic sectional views each illustrating the photoelectric conversion apparatus.

FIG. 10A is a sectional view illustrating the photoelectric conversion apparatus 930 according to a ninth exemplary embodiment. In the ninth exemplary embodiment, the photoelectric conversion apparatus 930 is a front-side illumination photoelectric conversion apparatus. Also, in the front-side illumination photoelectric conversion apparatus, the light-shielding portion 115 is disposed in the same manner as in the first exemplary embodiment, which can obtain the same beneficial effects. The front-side illumination photoelectric conversion apparatus includes the photoelectric conversion portions 1071 and 1072 provided in the photoelectric conversion layer 104, and can be configured with a wiring structure 801 appropriate for the intended use, formed over the surface 105 and with the light-shielding film 112 covering the light-shielded pixel region 102.

Figure 10B:
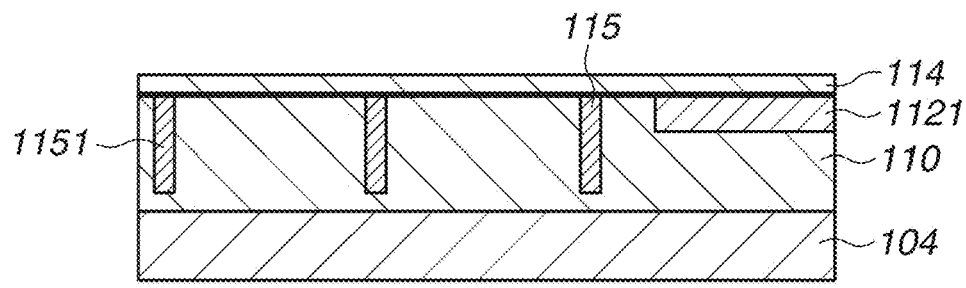

FIG. 10B is a sectional view illustrating the photoelectric conversion apparatus 930 according to a tenth exemplary embodiment. In the first exemplary embodiment, the light-shielding film 112 and the light-shielding portion 115 are separately formed, but instead may be formed at the same time. In the tenth exemplary embodiment, a shallow, wide groove 1121 for the light-shielding film 112 and a deep, narrow groove 1151 for the light-shielding portion 115 are formed in the dielectric layer 110. Further, a light-shielding material film is buried in the groove 1121 and the groove 1151 and then extra portions are removed, which produces in the light-shielding film 112 formed in the groove 1121 and the light-shielding portion 115 formed in the groove 1151. As the groove 1151 is deeper than the groove 1121, the lower end of the light-shielding portion 115 is located closer to the photoelectric conversion layer 104 than the lower surface of the light-shielding film 112. The distance between the upper end of the light-shielding portion 115 and the photoelectric conversion layer 104 is substantially equal to the distance between the upper surface of the light-shielding film 112 and the photoelectric conversion layer 104.

Figure 10C:
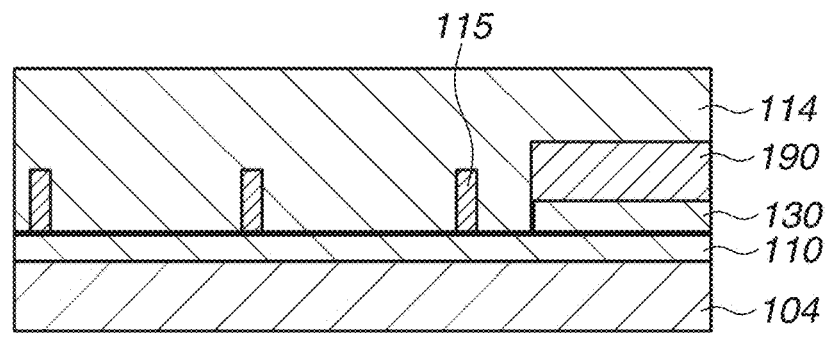

FIG. 10C is a sectional view of the photoelectric conversion apparatus 930 according to an eleventh exemplary embodiment. In the first exemplary embodiment, the light-shielding film 112 and the light-shielding portion 115 are separately formed, but instead may be formed at the same time. In the eleventh exemplary embodiment, a step forming member 190 is formed on the dielectric layer 110 in the light-shielded pixel region 102. A light-shielding material film that functions as the light-shielding film 112 and the light-shielding portion 115 is formed in the light-receiving pixel region 101 and the light-shielded pixel region 102 to cover the step forming member 190. A part of the light-shielding material film in the light-receiving pixel region 101 is removed. As a result, the light-shielding film 112 over the step forming member 190 and the light-shielding portion 115 can be obtained with the light-shielding material film. With the step forming member 190 provided, the lower end of the light-shielding portion 115 is located closer to the photoelectric conversion layer 104 than the lower surface of the light-shielding film 112. The upper end of the light-shielding portion 115 is located closer to the photoelectric conversion layer 104 than the upper surface of the light-shielding film 112. The height (distance from the lower end to the upper end) of the light-shielding portion 115 is substantially equal to the thickness (distance from the lower surface to the upper surface) of the light-shielding film 112.

The equipment 9191 illustrated in FIG. 1B will be described in more detail. The optical apparatus 940 is compatible with the photoelectric conversion apparatus 930. The optical apparatus 940 is, for example, a lens, a shutter, or a mirror. The control apparatus 950 controls the photoelectric conversion apparatus 930. The control apparatus 950 is a semiconductor device such as an application specific integrated circuit (ASIC). The processing apparatus 960 processes signals output from the photoelectric conversion apparatus 930. The processing apparatus 960 is a semiconductor device, such as a central processing unit (CPU) or an ASIC, for forming an analog front end (AFE) or a digital front end (DFE). The display apparatus 970 is an electroluminescence (EL) display apparatus or a liquid crystal display apparatus that displays information (images) obtained by the photoelectric conversion apparatus 930. The storage apparatus 980 is a magnetic device or a semiconductor device that stores the information (images) obtained by the photoelectric conversion apparatus 930. The storage apparatus 980 is a volatile memory such as a static random access memory (SRAM) or a dynamic RAM (DRAM), or a nonvolatile memory such as a flash memory or a hard disk drive.

The mechanical apparatus 990 includes a driving unit or a propulsion unit, such as a motor or an engine. In the equipment 9191, the display apparatus 970 displays signals output from the photoelectric conversion apparatus 930, and a communication apparatus (not illustrated) included in the equipment 9191 transmits the signals to the outside of the equipment 9191. For the operations, it is suitable for the equipment 9191 to further include the storage apparatus 980 and the processing apparatus 960, in addition to storage circuitry and arithmetic circuitry included in the photoelectric conversion apparatus 930. The mechanical apparatus 990 may be controlled based on signals output from the photoelectric conversion apparatus 930.

Further, the equipment 9191 is suitably used for an information terminal (e.g., a smartphone or a wearable terminal) with image capturing functionality, or an electronic device such as a camera (e.g., an interchangeable-lens camera, a compact camera, a video camera, or a surveillance camera). The mechanical apparatus 990 in a camera can drive the components of the apparatus 940 for zooming, focusing, or shutter operation. Alternatively, the mechanical apparatus 990 in the camera can move the photoelectric conversion apparatus 930 for image stabilization operation.

Further, the equipment 9191 can be a transportation apparatus such as a vehicle, a ship, or a flight vehicle. The mechanical apparatus 990 in a transportation apparatus can be used as a moving apparatus. The equipment 9191 serving as a transportation apparatus is suitably used for equipment that transports the photoelectric conversion apparatus 930, or equipment that assists and/or automates driving (manipulation) using the image capturing functionality. The processing apparatus 960 for assisting and/or automating driving (manipulation) can perform processing for operating the mechanical apparatus 990 serving as a moving apparatus based on information acquired by the photoelectric conversion apparatus 930. Alternatively, the equipment 9191 may be medical equipment such as an endoscope, measuring equipment such as a ranging sensor, analyzing equipment such as an electronic microscope, or office equipment such as a copying machine.

According to the above-described exemplary embodiments, excellent optical characteristics can be provided. Consequently, this can increase the value of the semiconductor device. The increase in value described herein corresponds to at least one of the addition of functions, enhancement in performance, improvement in characteristics, increase in reliability, rise in production yield, reduction in environmental load, cut in cost, decrease in size, or reduction in weight.

The use of the photoelectric conversion apparatus 930 according to the exemplary embodiments for the equipment 9191 therefore makes it possible to increase the value of the equipment. For example, the photoelectric conversion apparatus 930 mounted on a transportation apparatus provides an excellent performance in capturing the outside of the transportation or measuring the outside environment. Thus, the decision made to mount a semiconductor device according to the exemplary embodiments on a transportation apparatus has benefits in increasing the performance of the transportation apparatus for the manufacture and sale of the transportation apparatus. In particular, the photoelectric conversion apparatus 930 is suitably used in assisting a transportation apparatus and/or for a transportation apparatus performing automatic driving using information obtained by a semiconductor device.

The disclosure is not limited to the above-described exemplary embodiments, and can includes various modifications. For example, an example in which a part of the configuration of any of the exemplary embodiments is added to another exemplary embodiment or an example in which a part of the configuration of any of the exemplary embodiments is replaced with a part of the configuration of another exemplary embodiment is also one of the exemplary embodiments of the disclosure. The disclosed contents of this specification are not limited to those described in this specification, and include all matters that can be comprehended from this specification and the drawings accompanying this specification. Further, the disclosed contents of this specification include a complement to each concept described in this specification. That is, for example, if there is described "A is greater than B" in this specification, it can be said that this specification discloses that "A is not greater than B" even if the description of "A is not greater than B" has been omitted. This is because a case of the description that "A is greater than B" presumes a case where "A is not greater than B".

According to the present disclosure, a technique can be provided that is beneficial in terms of improvement of optical characteristics of photoelectric conversion apparatuses.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-072882, filed Apr. 15, 2020, which is hereby incorporated by reference herein in its entirety.

What is claimed is:

1. An apparatus including a light-receiving pixel region and a light-shielded region, the apparatus comprising:
    a photoelectric conversion layer including a plurality of photoelectric conversion portions;
    a light-shielding portion over the photoelectric conversion layer in the light-receiving pixel region, the light-shielding portion surrounding each light-transmitting portion as an optical path for light incident on each of the plurality of photoelectric conversion portions in the light-receiving pixel region; and
    a light-shielding film along a principal surface of the photoelectric conversion layer, the light-shielding film being over the photoelectric conversion layer in the light-shielded region,
    wherein the light-shielding portion includes a lower end and an upper end, and the lower end is an end nearer the photoelectric conversion layer than the upper end in a first direction perpendicular to the principal surface of the photoelectric conversion layer, and the upper end is an end opposite to the lower end of the light-shielding portion in the first direction, and the light-shielding portion extends from the lower end to the upper end,
    wherein the light-shielding film includes a lower surface and an upper surface, and the lower surface is a surface nearer the photoelectric conversion layer than the upper surface in the first direction, and the upper surface is a surface opposite to the lower surface of the light-shielding film in the first direction,
    wherein a distance in the first direction between the upper end of the light-shielding portion and the principal surface of the photoelectric conversion layer is larger than a distance in the first direction between the lower surface of the light-shielding film and the principal surface of the photoelectric conversion layer,
    wherein a distance in the first direction between the lower end of the light-shielding portion and the principal surface of the photoelectric conversion layer is smaller than the distance in the first direction between the lower surface of the light-shielding film and the principal surface of the photoelectric conversion layer,
    wherein in a plane including the light-shielding film and the light-shielding portion, a plurality of openings each defined by the light-shielding portion and a gap between the light-shielding portion and the light-shielding film are provided,
    wherein a width of the gap in a second direction in which one of the plurality of openings and the gap are arranged side by side is smaller than a width of one of the plurality of openings in the second direction, wherein a width of the light-shielding portion between the plurality of openings which are adjacent to each other in the second direction is smaller than a width of the light-shielding film in the second direction.

2. The apparatus according to claim 1, wherein the following inequality is satisfied:

$$B/D > (W+L)/L$$

where W is the width of the gap,
L is a width of the light-shielding portion in the first direction,
B is a distance in the first direction between the upper surface of the light-shielding film and the principal surface of the photoelectric conversion layer, and
D is the distance in the first direction between the lower end of the light-shielding portion and the principal surface of the photoelectric conversion layer.

3. The apparatus according to claim 2, wherein D<W is satisfied.

4. The apparatus according to claim 2, wherein D<W/2 is satisfied.

5. The apparatus according to claim 2, wherein W<B is satisfied.

6. The apparatus according to claim 3, wherein W<B is satisfied.

7. The apparatus according to claim 4, wherein W<B is satisfied.

8. The apparatus according to claim 2, wherein L<B is satisfied.

9. The apparatus according to claim 2, wherein W<L and/or B−D<W is satisfied.

10. The apparatus according to claim 8, wherein W<L and/or B−D<W is satisfied.

11. The apparatus according to claim 1, wherein the width of the gap is less than 500 nm.

12. The apparatus according to claim 1, wherein the distance in the first direction between the lower end of the light-shielding portion and the principal surface of the photoelectric conversion layer is less than 200 nm.

13. The apparatus according to claim 1, wherein the light-shielding portion includes a metal layer composed mainly of tungsten, and the light-shielding film includes a metal layer composed mainly of aluminum.

14. The apparatus according to claim 1, wherein the light-shielding film is disposed between a dielectric layer in contact with the light-shielding film and a dielectric film in contact with the light-shielding film.

15. The apparatus according to claim 14, wherein a combination of elements constituting the dielectric layer and a combination of elements constituting the dielectric film is different.

16. The apparatus according to claim 15, wherein the dielectric layer includes oxide silicon, and the dielectric film includes silicon nitride.

17. The apparatus according to claim 1, wherein the distance in the first direction between the upper end of the light-shielding portion and the principal surface of the photoelectric conversion layer is larger than a distance in the first direction between the upper surface of the light-shielding film and the principal surface of the photoelectric conversion layer.

18. The apparatus according to claim 1, wherein a groove is provided between a first photoelectric conversion portion and a second photoelectric conversion portion in the photoelectric conversion layer in the light-receiving pixel region, the first photoelectric conversion portion and the second photoelectric conversion portion being included in the plurality of photoelectric conversion portions.

19. The apparatus according to claim 1, wherein the light-shielding portion includes a first light-shielding portion and a second light-shielding portion located between the first light-shielding portion and the photoelectric conversion layer,
wherein the second light-shielding portion includes the lower end,
wherein the first light-shielding portion includes the upper end, and
wherein a width of the first light-shielding portion in the second direction is smaller than a width of the second light-shielding portion in the second direction.

20. The apparatus according to claim 1, wherein a light-shielding portion made of the same material as the light-shielding portion is provided over the light-shielding film.

21. The apparatus according to claim 1, wherein at least two photoelectric conversion portions are provided under the light-transmitting portion.

22. The apparatus according to claim 1, wherein a first lens and a second lens disposed between the first lens and the light-transmitting portion are provided over the light-transmitting portion.

23. The apparatus according to claim 16, wherein the dielectric film is provided at a lens portion.

24. The apparatus according to claim 1, further comprising a wiring structure portion provided, with regard to the photoelectric conversion layer, on a side opposite to a side on which the light-shielding film is provided.

25. An equipment comprising:
the apparatus according to claim 1; and
at least one of the following:
an optical device compatible with the apparatus;
a controller configured to control the apparatus;
a processing device configured to process a signal output from the apparatus;
a display configured to display information obtained from the apparatus;
a storage configured to store the information obtained from the photoelectric conversion apparatus; or
a mechanical device configured to operate based on the information obtained from the apparatus.

26. The apparatus according to claim 14, wherein the dielectric layer is in contact with the dielectric film in the light-receiving pixel region.

27. The apparatus according to claim 14, wherein the dielectric film and the dielectric layer each include a portion extending from the light-shielding film to the light-shielding portion, the light-shielding portion penetrates through the portion of the dielectric film, and the lower end of the light-shielding portion is in contact with the portion of the dielectric layer.

28. The apparatus according to claim 14, wherein the dielectric film is in contact with a side surface of the light-shielding film.

29. An apparatus including a light-receiving pixel region and a light-shielded region, the apparatus comprising:
a photoelectric conversion layer including a plurality of photoelectric conversion portions;
a light-shielding portion over the photoelectric conversion layer in the light-receiving pixel region, the light-shielding portion surrounding each light-transmitting portion as an optical path for light incident on each of the plurality of photoelectric conversion portions in the light-receiving pixel region;

a light-shielding film along a principal surface of the photoelectric conversion layer, the light-shielding film being over the photoelectric conversion layer in the light-shielded region, and a wiring structure portion provided, with regard to the photoelectric conversion layer, on a side opposite to a side on which the light-shielding film is provided, wherein the light-shielding portion includes a lower end and an upper end, and the lower end is an end nearer the photoelectric conversion layer than the upper end in a first direction perpendicular to the principal surface of the photoelectric conversion layer, and the upper end is an end opposite to the lower end of the light-shielding portion in the first direction, wherein the light-shielding film includes a lower surface and an upper surface, and the lower surface is a surface nearer the photoelectric conversion layer than the upper surface in the first direction, and the upper surface is a surface opposite to the lower surface of the light-shielding film in the first direction, wherein a distance in the first direction between the upper end of the light-shielding portion and the principal surface of the photoelectric conversion layer is larger than a distance in the first direction between the lower surface of the light-shielding film and the principal surface of the photoelectric conversion layer, wherein a distance in the first direction between the lower end of the light-shielding portion and the principal surface of the photoelectric conversion layer is smaller than the distance in the first direction between the lower surface of the light-shielding film and the principal surface of the photoelectric conversion layer, wherein in a plane including the light-shielding film and the light-shielding portion, a plurality of openings each defined by the light-shielding portion and a gap between the light-shielding portion and the light-shielding film are provided, wherein a width of the gap in a second direction in which one of the plurality of openings and the gap are arranged side by side is smaller than a width of one of the plurality of openings in the second direction, wherein a width of the light-shielding portion between the plurality of openings which are adjacent to each other in the second direction is smaller than a width of the light-shielding film in the second direction.

30. An equipment comprising:
the apparatus according to claim 29; and
at least one of the following:
an optical device compatible with the apparatus;
a controller configured to control the apparatus;
a processing device configured to process a signal output from the apparatus;
a display configured to display information obtained from the apparatus;
a storage configured to store the information obtained from the photoelectric conversion apparatus; or
a mechanical device configured to operate based on the information obtained from the apparatus.

31. The apparatus according to claim 1, wherein the distance in the first direction between the upper end of the light-shielding portion and the principal surface of the photoelectric conversion layer is larger than a distance in the first direction between the upper surface of the light-shielding film and the principal surface of the photoelectric conversion layer.

32. The apparatus according to claim 1, further comprising a layer including an inner lens, wherein the light-shielding film is disposed between the layer and the photoelectric conversion layer.

33. The apparatus according to claim 29, wherein the distance in the first direction between the upper end of the light-shielding portion and the principal surface of the photoelectric conversion layer is larger than a distance in the first direction between the upper surface of the light-shielding film and the principal surface of the photoelectric conversion layer.

34. The apparatus according to claim 29, further comprising a layer including an inner lens, wherein the light-shielding film is disposed between the layer and the photoelectric conversion layer.

* * * * *